United States Patent
Washio et al.

(10) Patent No.: US 8,278,965 B2
(45) Date of Patent: Oct. 2, 2012

(54) INSPECTION APPARATUS

(75) Inventors: Kenichi Washio, Tokyo (JP); Katsuo Yasuta, Tokyo (JP); Toshikazu Oshima, Tokyo (JP); Takehiko Hirai, Tokyo (JP)

(73) Assignee: Kabushiki Kaisha Nihon Micronics (JP)

( * ) Notice: Subject to any disclaimer, the term of this patent is extended or adjusted under 35 U.S.C. 154(b) by 283 days.

(21) Appl. No.: 12/772,557

(22) Filed: May 3, 2010

(65) Prior Publication Data
US 2010/0289514 A1 Nov. 18, 2010

(30) Foreign Application Priority Data
May 18, 2009 (JP) ................... 2009-120106

(51) Int. Cl.
*G01R 31/40* (2006.01)
(52) U.S. Cl. .................. 324/764.01; 324/703
(58) Field of Classification Search .............. 324/760
See application file for complete search history.

(56) References Cited

U.S. PATENT DOCUMENTS
4,916,287 A * 4/1990 Soden et al. ............... 219/202

FOREIGN PATENT DOCUMENTS
| JP | 2000-241454 | 9/2000 |
| JP | 2004-150999 | 5/2004 |
| JP | 2008-298749 | 12/2008 |

OTHER PUBLICATIONS
Akio, JP 2004-150999, Machine Translation, p. 1-15.*
Chikaomi, JP 2008-298749, Machine Translation, p. 1-9.*

* cited by examiner

*Primary Examiner* — Thomas Valone
(74) *Attorney, Agent, or Firm* — Bacon & Thomas, PLLC

(57) ABSTRACT

The inspection apparatus includes a probe having a contact for contacting an electrode of an inspected object and having a built-in heater for correcting dislocation of the contact to the electrode caused by temperature difference between the probe and the inspected object; a tester for testing the probe and supplying electric power to the heater; an electric power supply, provided on the tester, for supplying electric power to the heater; and a temperature control unit for controlling electric power to the heater of the probe through the electric power supply, wherein the electric power supply includes at least one open/close switch for switching power to the heater on and off. A connector has a male connector and a female connector on opposing ends. A continuity-checking device checks supply of electric power to the heater from the electric power supply.

6 Claims, 8 Drawing Sheets

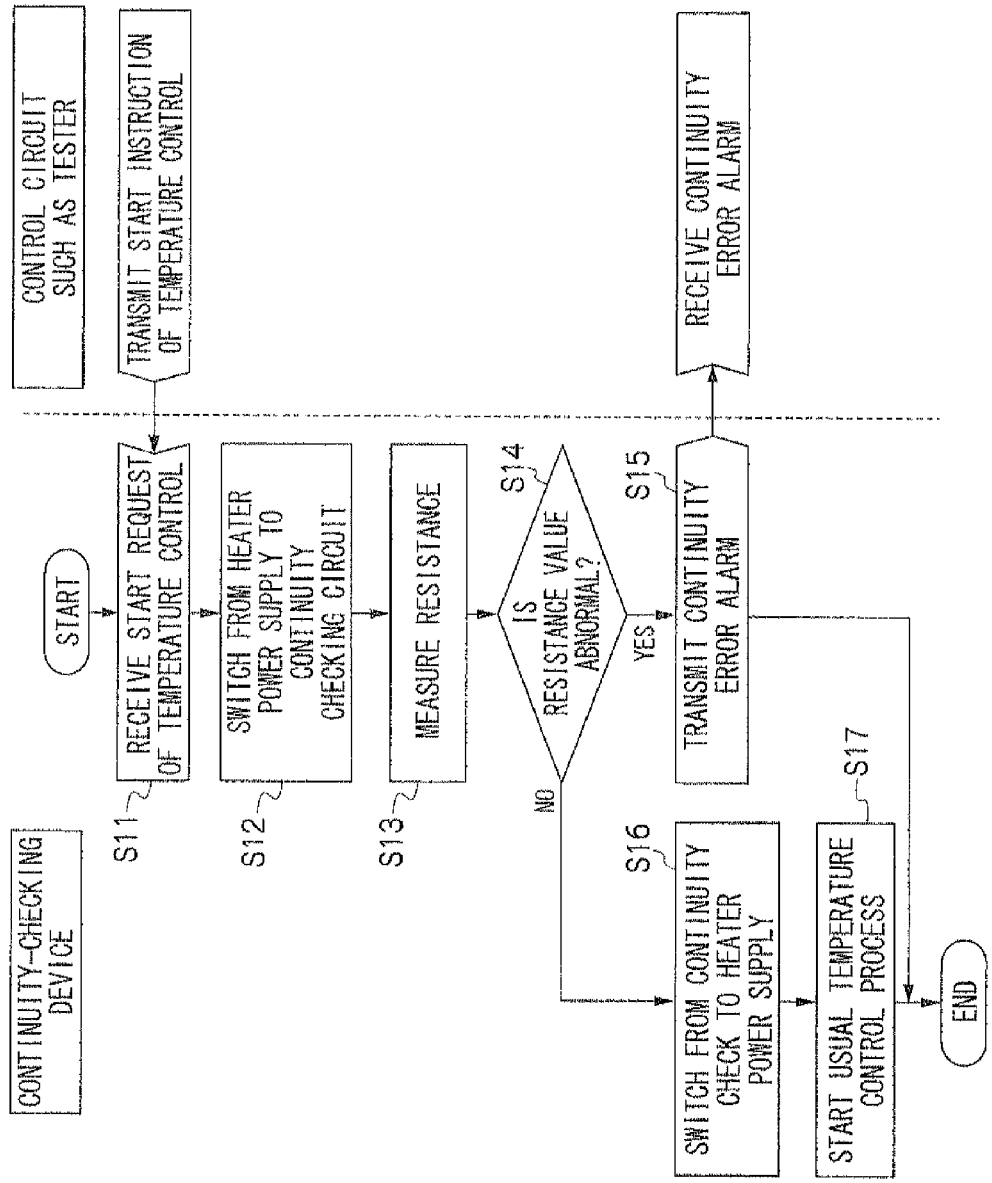

INSPECTION APPARATUS

CROSS-REFERENCE TO RELATED APPLICATION

This application claims, under 35 USC 119, priority of Japanese Application No. 2009-120106 filed May 18, 2009.

BACKGROUND OF THE INVENTION

1. Field of the Invention

The present invention relates to an inspection apparatus for performing inspection by causing a contact to bring into contact with an inspected object under a preset temperature and applying an inspection signal.

2. Description of the Related Art

An inspection apparatus for performing inspection by heating an inspected object such as a semiconductor wafer to a preset temperature, causing a contact to bring into contact with an electrode of the inspected object, and applying an inspection signal is generally known.

In such an inspection apparatus, a heater is provided on one or both of the inspected object and a probe card arranged in a manner of adjusting the contact to an electrode arrangement of the inspected object to heat the inspected object and/or the probe card to a preset temperature, and an inspection is performed. However, recently, a probe card having a built-in heater has been used to avoid dislocating a contact from an electrode while heating.

In addition, when a size of the inspected object is changed, the probe card is replaced in accordance with the inspected object.

Examples of such an inspection apparatus are disclosed by Japanese Patent Laid-Open No. 2000-241454, 2004-150999 and 2008-298749.

However, in each of above-mentioned conventional technologies, a temperature can be neither precisely nor accurately controlled.

Moreover, a heater and the like may generate a noise wave and the noise wave can cause various problems when a high-precision inspection is performed.

Further, when the probe card is replaced, connection failure may occur in a connection portion of a heater power supply cable connected between the inspection apparatus and the probe card, thereby lacking safety and certainty.

SUMMARY OF THE INVENTION

It is therefore an object of the present invention to solve the aforementioned problems and to provide an inspection apparatus for improving inspection accuracy by controlling temperature accurately, cutting a noise wave, and overcoming contact failure.

An inspection apparatus according to the present invention includes a probe device having a contact for contacting with an electrode of an inspected object and having a built-in heater for correcting dislocation of the contact to the electrode caused by temperature difference between the probe device and the inspected object; a tester for testing probe device and supplying electric power to the heater; an electric power supply system, provided on the tester, for supplying electric power to the heater; and a temperature control unit for controlling electric power to the heater of the probe device through the electric power supply system, wherein the electric power supply system includes at least one open/close switch for switching on and off power supply to the heater. Moreover, the inspection apparatus according to the present invention may include a connector having a male connector provided on one end of a wiring of the electric power supply system and a wiring of the probe device and a female connector provided on the other end. Further, in the inspection apparatus according to the present invention, a continuity-checking device may check to be able to supply electric power to the heater from the electric power supply system.

Temperature can be controlled accurately, a heater power supply is interrupted by the heater power controlling open/close switch, and a noise wave can be cut. Further, the continuity-checking device can be used to check whether or not the connecting point of the electric power supply system contacts accurately. It is therefore an object of the present invention to provide an inspection apparatus which improves inspection accuracy.

BRIEF DESCRIPTION OF THE DRAWINGS

FIG. 8 is a flowchart showing control proceeding of the continuity-checking device of the inspection apparatus according to the second embodiment of the present invention.

DESCRIPTION OF THE PREFERRED EMBODIMENTS

Figure 1:
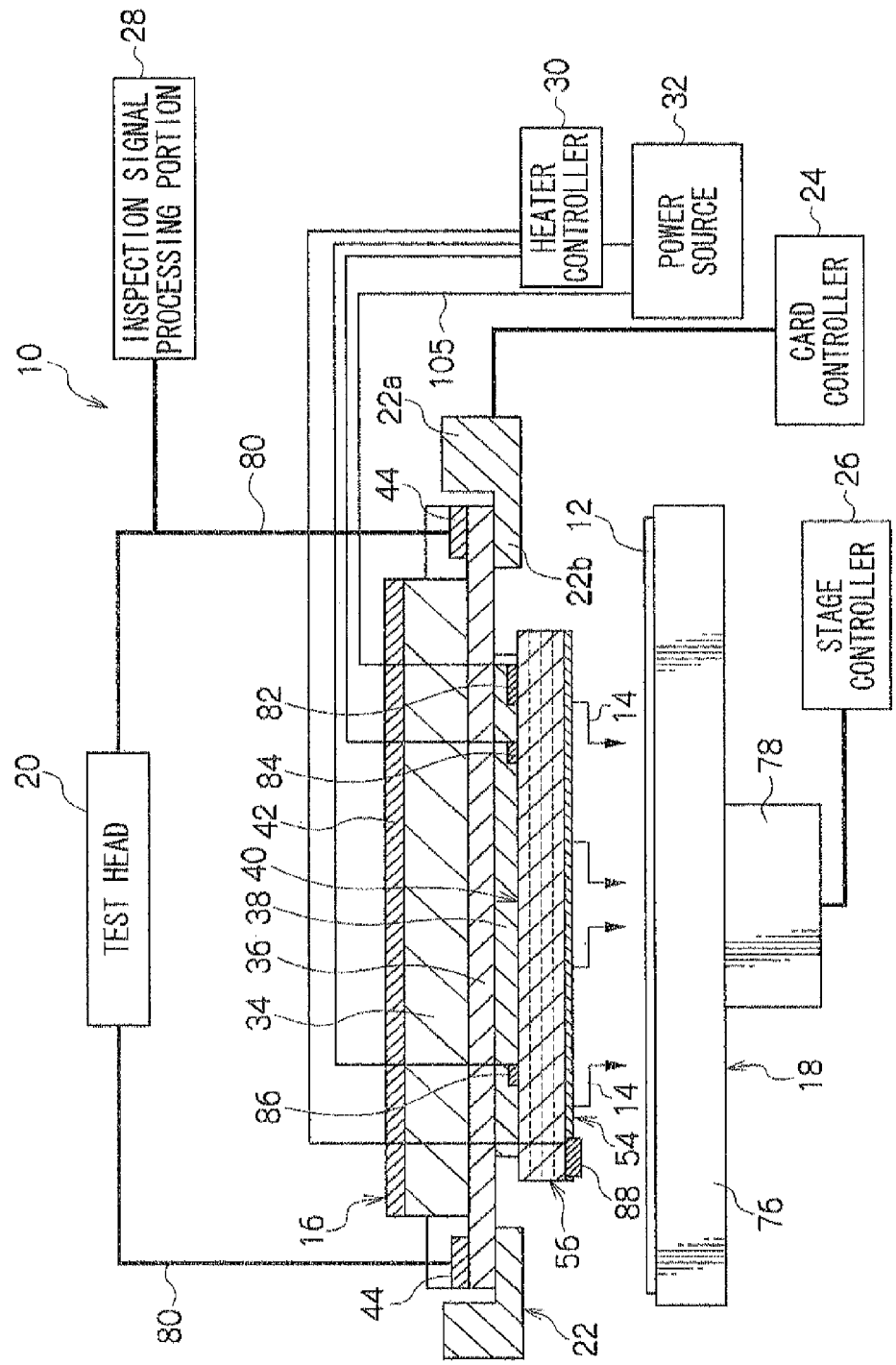
FIG. 1 is a schematic view showing a structure of an inspection apparatus according to the present invention.

Hereinafter, an embodiment of an inspection apparatus according to the present invention will be described referring to the attached drawings.

(A) First Embodiment

A first embodiment of an inspection apparatus according to the present invention will be described referring to the attached drawings. The inspection apparatus according to the present invention is an inspection apparatus improved in such a manner as to perform high-precision inspection by accurate temperature control and a noise wave cut.

First, an inspection apparatus 10 according to the present embodiment will be described with reference to FIG. 1. The inspection apparatus 10 is an apparatus, using a disk-shaped semiconductor wafer 12 as an inspected object, for inspecting a plurality of integrated circuits formed on the semiconductor wafer 12. Each of the integrated circuits has a plurality of electrodes (not shown) such as a pad electrode on an upper surface of the semiconductor wafer 12.

The inspection apparatus 10 includes a probe device, namely, a probe card 16, an inspection stage 18, a test head 20, a card holder 22, a card controller 24, and a stage controller 26, an inspection signal processing portion 28, a heater controller 30, and a power source 32. The probe card 16 has contacts 14 for contacting with electrodes of the semiconductor wafer 12 and incorporates heaters 62 (see FIG. 3) for correcting dislocation caused by a temperature difference between the electrodes and the contacts 14. The inspection stage 18 is provided with the semiconductor wafer 12. The test head 20 is electrically connected to the probe card 16. The card holder 22 holds the probe card 16 on the peripheral portion. The card controller 24 controls distance and/or inclination of the card holder 22 to the inspection stage 18. The stage controller 26 controls a position of the inspection stage 18 to the card holder 22. The inspection signal processing portion 28 controls the test head 20 and the contacts 14 for transmitting and receiving an inspection signal (namely, electric signals such as a supply signal supplied to integrated circuits for inspection, and a response signal from the integrated circuits to the supply signal) to the contacts 14. The heater controller 30 controls a temperature of the probe card 16. The power source 32 supplies a heating power (heating current).

The probe card 16 includes a reinforcing member 34 having a flat lower surface, a circular, flat-shaped circuit board 36 provided on a lower surface of the reinforcing member 34, a flat-shaped electric connector 38 provided on a lower surface of the circuit board 36, a probe base 40 provided on a lower surface of the electric connector 38, and a disk-shaped cover 42 provided on the reinforcing member 34. These components 34 to 42 are separably and firmly assembled by a plurality of bolts.

Figure 2:
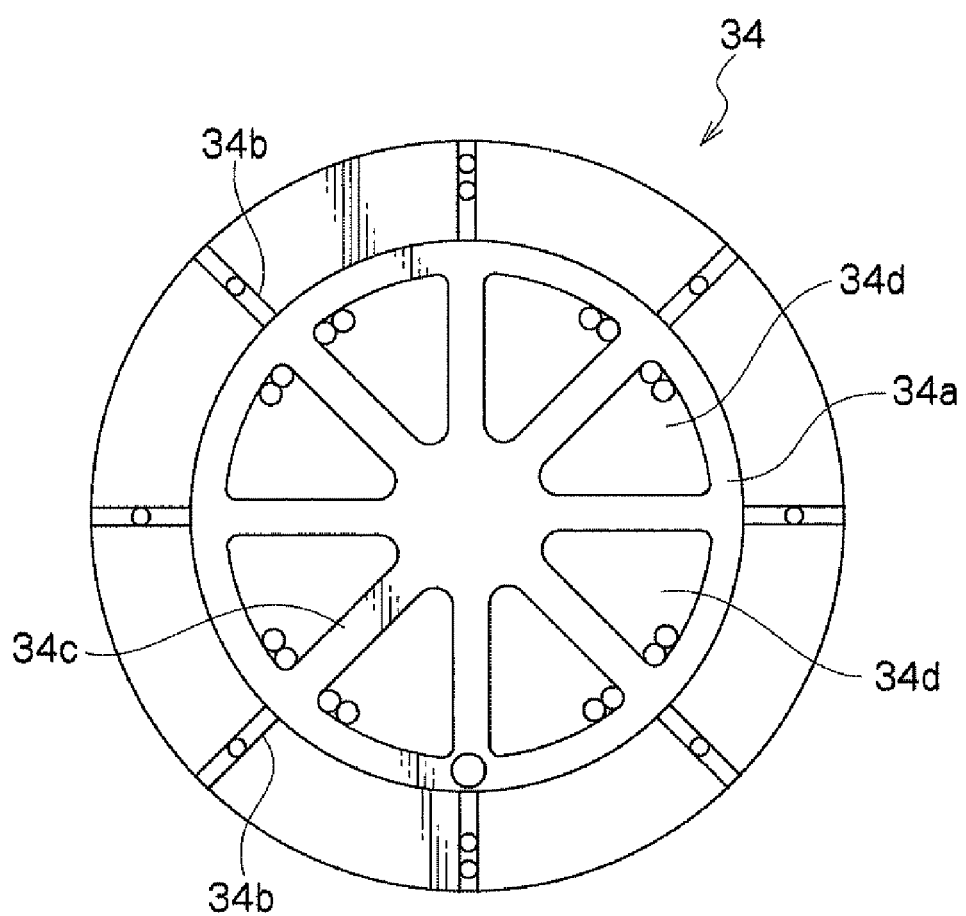
FIG. 2 is a plan view showing a reinforcing member according to a first embodiment of the present invention.

The reinforcing member 34 is a plate and is made of metal material such as stainless steel. As shown in FIG. 2, the reinforcing member 34 includes an annular portion 34a, a plurality of extensions 34b extending radially outward from the annular portion 34a, and central frame portions 34c which are inside of annular portions 34a, integrally connected to the extensions 34b. The reinforcing member 34 has spaces 34d, which are open in both an upward and downward direction, defined by the portions 34a to 34e.

A plurality of connectors 44 connected to the test head 20 are arranged on an annular peripheral portion of an upper surface of the circuit board 36 shown in FIG. 1. Each of the connectors 44 includes a plurality of terminals (not shown) electrically connected to internal wirings (not shown).

The reinforcing member 34 and the circuit board 36 are coaxially coupled by a plurality of fastening members (not shown) with a lower surface of the reinforcing member 34 and an upper surface of the circuit board 36 mutually contacted.

The electric connector 38 is described and well known in Japanese Patent Laid-Open No 2008-145238, for example. The electric connector 38 includes a plurality of well known electric connecting pins (not shown) such as a pogo pin which vertically penetrate through an electrically insulated pin holder, and electrically connects an internal wiring of the circuit board 36 and a conductive passage (not shown) of the probe base 40 and a power supply passage 48 (see FIG. 4) with a power supply passage (not shown) of the probe base 40 by the connecting pins.

The electric connector 38 is coupled to a lower surface of the circuit board 36 in the pin holder by a plurality of fastening members (not shown) with an upper surface of the pin holder connecting the lower surface of the circuit board 36.

Moreover, upper ends of the connecting pins are upwardly excited by springs, and lower ends of the connecting pins are downwardly excited by springs, and the upper end presses to an internal wiring (not shown) of the circuit board 36 or a terminal (not shown) connected to the lower end of the power supply passage 48, and the lower end presses to another terminal provided on an upper surface of the probe base 40.

The probe base 40 is a multi-layer circuit board configured so that a flexible multi-layer sheet 54 formed by electrically insulated resin such as polyimide resin is provided on a lower surface of a multi-layer ceramic base 56, and the contacts 14 are cantilevered and arranged to a lower surface of the multi-layer sheet 54.

The multi-layer sheet 54 has a plurality of inner wirings (not shown) therein and a well known structure and configuration having a plurality of probe lands (not shown) electrically connected to the inner wirings on a lower surface, and is formed integrally with the ceramic base 56.

The contacts 14 are cantilevered and attached to the probe lands by bonding by a conductive bonding material such as solder or by a method such as welding by laser while the tip end portion (needle point) protrudes downward.

The ceramic base 56 includes a plurality of heating layers (heaters 62 in FIG. 3) and a plurality of conductive layers (not shown) alternatively. Specifically, a plurality of (four layers in this embodiment) heating layers separated by a predetermined distance in a thickness direction (vertical direction in the example of FIG. 3) are arranged, and a plurality of conductive layers are also arranged between heating layers adjacent in the thickness direction, on an upper side of a top heating layer and on a lower side of a bottom heating layer.

The card holder 22 is made of metal material such as stainless steel and resin material such as polyimide, and includes a ring shaped peripheral portion 22a and a step portion 22b extending inward from a lower end of the peripheral portion 22a so as to be formed like an inward flange. The step portion 22b is formed like an inward flange and supports a lower face of a peripheral portion of the circuit board 36.

The probe card 16 is attached on the step portion 22b of the card holder 22 by a plurality of fastening members (not shown) on the extensions 34b of the reinforcing member 34 and a peripheral portion of the circuit board 36 so that it is supported and the probe card 16 is positioned below a casing of the test head 20.

The card holder 22 is attached to a frame or casing of the inspection apparatus 10 through a card holding mechanism (not shown) capable of changing an inclination of the card holder 22 to the inspection stage 18.

In advance of an inspection, especially, an inspection of one lot of inspected object or one inspected object, the above mentioned card holding mechanism is controlled by the card controller 24, changes a distance and/or inclination of the card holder 22 to the inspection stage 18, in other words, the card holding mechanism changes a distance and/or inclination of the probe card 16. Therefore, the probe card 16 is aligned so that virtual needle point surfaces included by needle points of the contacts 14 have a predetermined distance and position with respect to the semiconductor wafer 12 placed on a chuck top 76.

The inspection stage 18 includes a stage, namely, a chuck top 76 for releasably vacuum-adsorbing the semiconductor wafer 12, and a chuck top moving mechanism 78 capable of moving the chuck top 76 three-dimensionally in a front and rear direction, a right and left direction and an upper and lower direction (i.e., XYZ directions) with respect to the probe card 16 and rotationally moving the chuck top 76 (i.e., θ direction) around an axis extending in the upper and lower direction.

The inspection stage 18 is moved in the front and rear direction and the right and left direction with respect to the probe card 16 by a stage moving mechanism (not shown).

During inspection of the semiconductor wafer 12, the inspection stage 18 is prevented from moving in the front and rear direction and the right and left direction, but the inspection stage 18 is moved in the front and rear direction and the right and left direction by the stage moving mechanism for replacing one lot of semiconductor wafers 12 to be inspected.

In advance of an inspection of the semiconductor wafer 12, the chuck top moving mechanism 78 is controlled by the stage controller 26 to three dimensionally move and rotate the chuck top 76. Therefore, the semiconductor wafer 12 placed on the chuck top 76 is aligned so that electrodes of integrated circuits provided on the semiconductor wafer 12 oppose the needle points of the contacts 14.

When the semiconductor wafer 12 to be inspected is replaced, the chuck top 76 is lowered to a position, where the semiconductor wafer 12 is not in contact with the contacts 14, by the chuck top moving mechanism 78 and is maintained in the position.

The test head 20 electrically connects inspected elements (integrated circuit) through the probe card 16 by contacting an electric connecting pin to contact terminals of a base end of the probe card 16. The test head 20 electrically connects the inspection apparatus and the inspected elements, and inspects electrical characteristics by contacting the electric connecting pin to the contact terminals of the base end of the probe card 16.

Inspection signals supplied to predetermined terminals of connectors 44 are supplied to predetermined contacts 14 through internal wirings of the circuit board 36, the electric connector 38, the ceramic base 56 and the multi-layer sheet 54. Response signals from the semiconductor wafer 12 are supplied to other terminals of the connectors 44 through the integrated wiring similar to the above mentioned internal wirings.

The inspection signal processing portion 28 includes an inspection signal power source (not shown) for inspection signals. The inspection signal power source is separated from the power source 32. In the example shown in the drawing, the power supply 32 functions as a power supply for power consumption members.

The power supply 32 supplies heating power to a power supply passage through a thermal fuse 82 provided on the ceramic base 56. Although not explicitly shown by drawings, the thermal fuse 82 is provided on a supply passage of a current for heating from the power supply 32 to the power supply passage.

As with general electrical fuses, when a temperature of the ceramic base 56 exceeds a tolerance, the thermal fuse 82 is disconnected to interrupt a supply passage of heating electric power between the power supply 32 and the power supply passage. Therefore, safety of the probe card 16 is maintained.

The probe card 16 further includes a temperature sensor 84 and an overheat protecting member 86 provided on an upper surface of the ceramic base 56 of the probe base 40, and a stage sensor 88 provided on the lower surface of the multi-layer sheet 54 of the probe base 40. These sensors 84 and 88 and the member 86 are connected to the heater controller 30.

Next, circuit arrangement of a control system of the inspection apparatus will be described with reference to FIG. 3. A temperature control system of the inspection apparatus includes a temperature control unit 121, a tester unit 122 and a probe card unit 123.

The temperature control unit 121 controls four layers of heaters 62 of the probe card unit 123 through an electric power supply system. The temperature control unit 121 includes the heater controller 30 and the power supply 32.

Then, the heater controller 30 includes a temperature controller 124 and a power controller 125.

The temperature controller 124 adjusts a power supplied from the power supply 32 and controls a temperature of the heaters 62 of the probe card unit 123. The temperature controller 124 is connected to a control sensor 126 which is described later built in the probe card unit 123, and monitors temperatures of four heaters 62 of the probe card unit 123 to adjust the power supplied from the power supply 32.

The power controller 125 prevents overheat of the heaters 62 of the probe card unit 123 and prevents a noise wave generated when inspection is performed under heating to a preset temperature by the heaters 62, by adjusting the power supplied from the power supply 32. The power controller 125 is connected to an overheat sensor 127 which is described later built in the probe card unit 123. The power controller 125 stops power supply from the power supply 32 when inspection is performed and when temperatures of the heaters 62 of the probe card unit 123 exceed the preset value to be high in temperature. Specifically, power supply break relays 128 are provided in the temperature control unit 121 and the relays 128 are opened to stop electric power supply.

The tester unit 122 transmits an inspection signal from the inspection signal processing portion 28 to the probe card unit 123. The tester unit 122 transmits a detection signal from the control sensor 126 and the overheat sensor 127 to the temperature control unit 121. The tester unit 122 supplies electric power to the heaters 62. The tester unit 122 has therein wirings of the signal transmission-reception system constituted by signal lines, and a wiring of the electric power supply system for supplying electric power to the heaters 62. Namely, the tester unit 122 has a signal cable and an electric power supply cable.

The probe card unit 123 contacts electrodes of integrated circuits on an upper surface of the semiconductor wafer 12 and applies an inspection signal. The probe card unit 123 includes the contacts 14 for directly contacting the electrodes and a heating portion 130 for heating entirely the probe card unit 123 to prevent dislocation caused by thermal expansion. The heating portion 130 includes four heaters 62, the control sensor 126, and the overheat sensor 127. Although the heaters 62 have four layers in this embodiment, the heaters 62 may be optional in a shape, the number of layers and the like capable of effectively heating entirely the probe card unit 123. The control sensor 126 detects a temperature of the probe card unit 123 and transmits the value of the temperature to the temperature control unit 121. The overheat sensor 127 detects a temperature of the heaters 62 and transmits the value of the temperature to the temperature control unit 121. The temperature control unit 121 adjusts power supplied to the heaters 62 based on the temperature value from the control sensor 126 and stops electric power supplied to the heaters 62 when the temperature value from the overheat sensor 127 exceeds the preset value.

Figure 4:
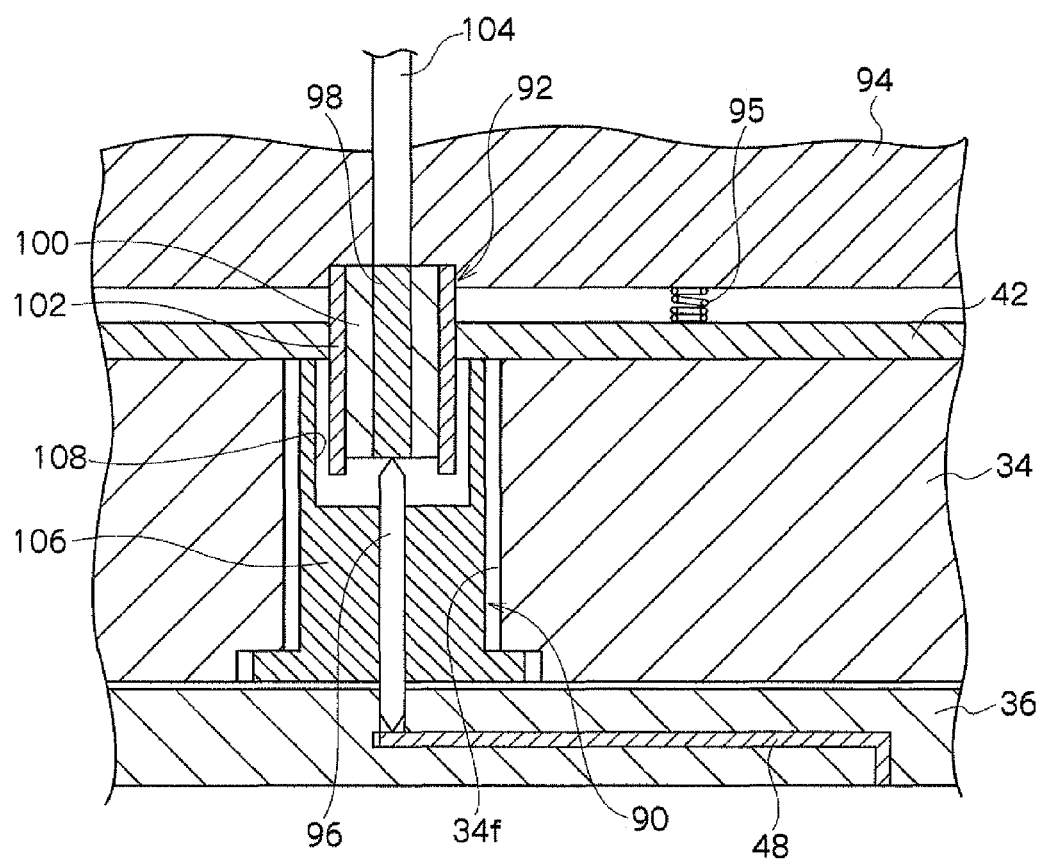
FIG. 4 is a sectional view showing a connector according to the first embodiment of the present invention.

A connector 132 for detachably connecting signal cables and electric power supply cables is provided between the tester unit 122 and the probe card unit 123. Specifically, the connector 132 is constituted as follows:

The connector 132 includes male connectors provided on one end of a wiring of the electric power supply system of the tester unit 122 and a wiring of the probe card unit 123, and female connectors provided on the other end. In this embodiment, as shown in FIG. 4, a male connector 92 is connected to a wiring passage 104 of the electric power supply system and a female connector 90 is connected to a wiring of the probe card unit 123.

The male connector 92 includes a bar-shaped conductive 98 connected to the wiring of the electric power supply system, a supporting portion 100 made of an electrical insulating material for surrounding and supporting the conductive portion 98, and a protective cylinder 102 made of an electrical insulating material for internally holding the supporting portion 100.

The male connector 90 includes an electric insulator 106 having a recess 108 opened to the male connector 92 for detachably holding the male connector 92, and a connection bar (i.e., connecting pin; pogo pin) 96 slidably supported in the electric insulator 106 for protruding to the recess 108.

Electric power for heating from the power supply 32 is supplied to the circuit board 36 from a bottom plate 94 of the test head 20. In this embodiment, the female and male connectors 90 and 92 which are separably coupled to supply electric power for heating are used.

A space is formed between the cover 42 and the bottom plate 94, and a plurality of coil springs 95 are provided in the space. Therefore, the cover 42 and the bottom plate 94 have a structure capable of approaching to and separating from each other.

The female connector 90 is positioned in a space 34f of the reinforcing member 34. The female connector 90 is combined to the circuit board 36 by a fastening member, a fitting means, or the like so as to rise from the circuit board 36. The female connector 90 includes a plurality of pogo pins 96 used as the connection bars which function as terminals of the connector 90. Each of the pogo pins 96 is one well-known for exciting the upper and lower ends in the directions separated from each other by spring force, and the pogo pin 96 connects the lower end to the power supply passage 48.

The male connector 92 is combined to the bottom plate 94 of the test head 20 by means such as a plurality of fastening means, fitting means or the like, while a lower portion of the protective cylinder 102 extends the space 34f in the reinforcing member 34 downward and the lower surface of the conductive portion 98 contacts the upper end of the corresponding pogo pin 96.

The conductive portion 98 corresponds to the pogo pin 96, and is provided at the same pitch as the pogo pin 96 so that the upper end of the corresponding pogo pin 96 contacts the lower surface of the conductive portion 98. The upper end of the conductive portion 98 is electrically connected to the lower end of the wiring passage 104 for electric power for heating.

As a substitute for the conductive portion 98, the lower end of the wiring passage 104 may be used as a conductive portion by extending the wiring passage 104 to the lower end of the supporting portion 100. A conductive terminal may be used as a conductive portion by providing the conductive terminal corresponding to the pogo pin 96 to the lower surface of the supporting portion 100 and electrically connecting the terminals to the wiring passage 104. The protective cylinder 102 may be omitted.

Each of the wiring passages 104 is coupled to the conductive portion 98 so as to continue upward from the conductive portion 98, and is connected to the power supply 32 through a wiring 105 (see FIG. 1) for supplying electric power for heating. The electric power for heating is supplied to the pogo pin 96 through the wiring passage 104 and the conductive portion 98.

The pogo pin 96 functions as a connection portion, namely, a terminal of the circuit board 36, for passing electric power for heating, and the conductive portion 98 functions as a connection portion, namely, a terminal of the bottom plate 94, for passing electric power for heating. The bottom plate 94 functions as a plate-shaped member.

In the example shown in FIG. 4, each pogo pin 96 is slidably supported in the electric insulator 106, and extended vertically. Each pogo pin 96 is supported by the electric insulator 106 while the upper end protrudes into the recess 108. The pogo pins 96 are connected to the heaters 62 through connecting pins and power supply passages (both are not shown) while the lower end of the pogo pin 96 contacts the power supply passage 48 for supplying electric power for heating.

As a substitute for the pogo pin 96, another pin member or a protrusion member may be used. The connector 90 may be a male connector, and the connector 92 may be a female connector. The female connector 90 may be provided on the bottom plate 94, and the connector 92 may be provided on the circuit board 36. In the latter case, the supporting portion 100 is connected to the power supply passage 48 in the circuit board 36, and the pogo pin 96 is electrically connected to the wiring passage 104. In this structure, the pogo pin 96 and the conductive portion 98 are electrically securely connected. When the probe card 16 is replaced, the pogo pin 96 and the conductive portion 98 are detached. When a new probe card 16 is attached, the pogo pin 96 and the conductive portion 98 are easily, securely, and electrically connected.

In the example shown in FIG. 4, the bottom plate 94 of the test head 20 is made of an electrical insulating material. However, only the surroundings of the connector 92 and the wiring passage 104 may be made of an electrical insulating material.

Figure 3:
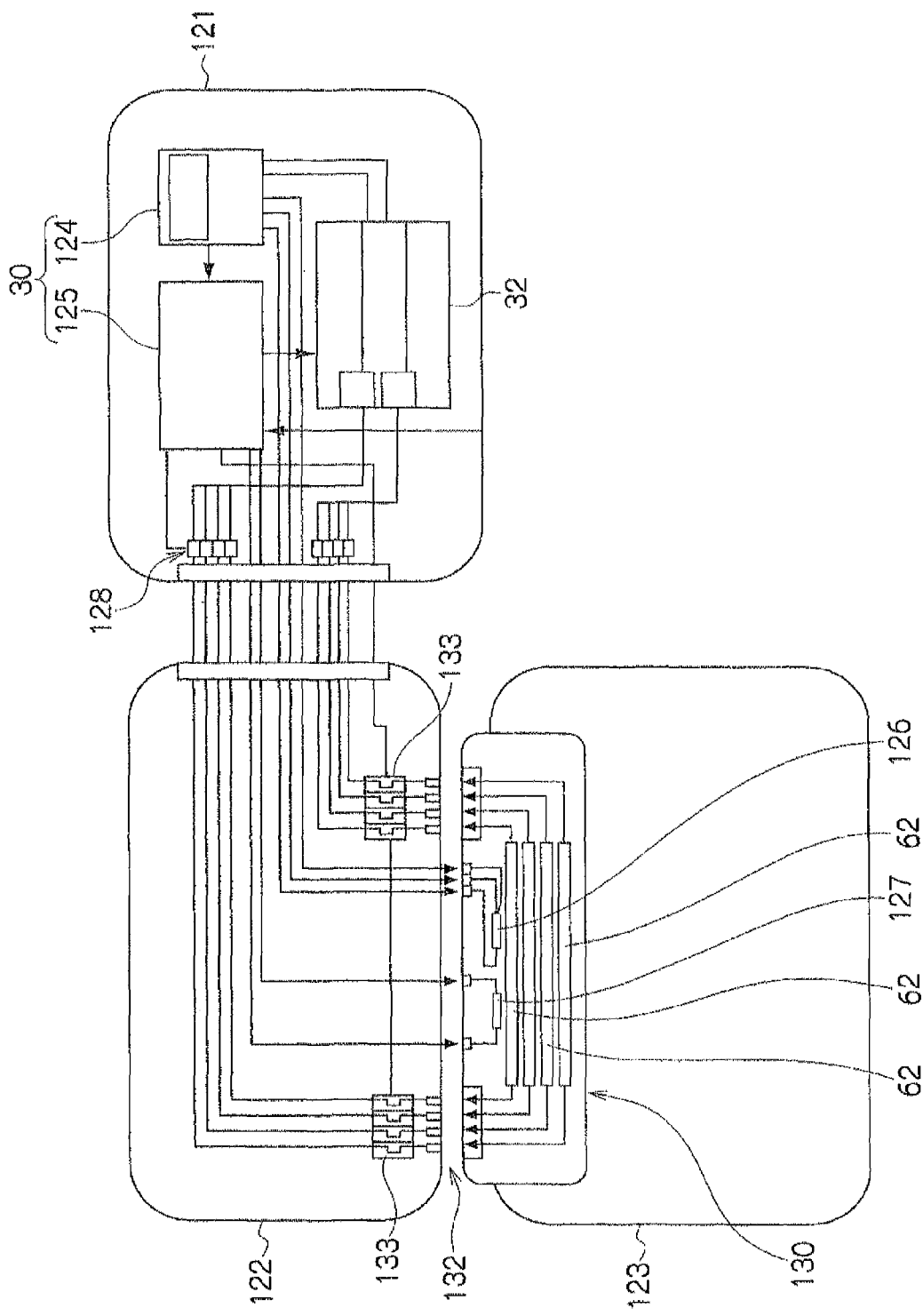
FIG. 3 is a schematic view showing a circuit structure of a control system of the inspection apparatus according to the first embodiment of the present invention.

As shown in FIG. 3, heater power interrupting relays 133 are provided as heater power controlling open/close switch at the portion of the electric power supply cable, just before the connector 132, in the tester unit 122. The heater power interrupting relays 133 are relays for reducing a noise wave given from the electric power supply cables to the heaters 62. Relay contacts of the heater power interrupting relays 133 are opened to stop electric power supply when the inspection is performing after the heaters 62 heat the probe card unit 123 to a preset temperature. Because electric power supply is stopped, generation of a noise wave is suppressed more securely.

Figure 5:
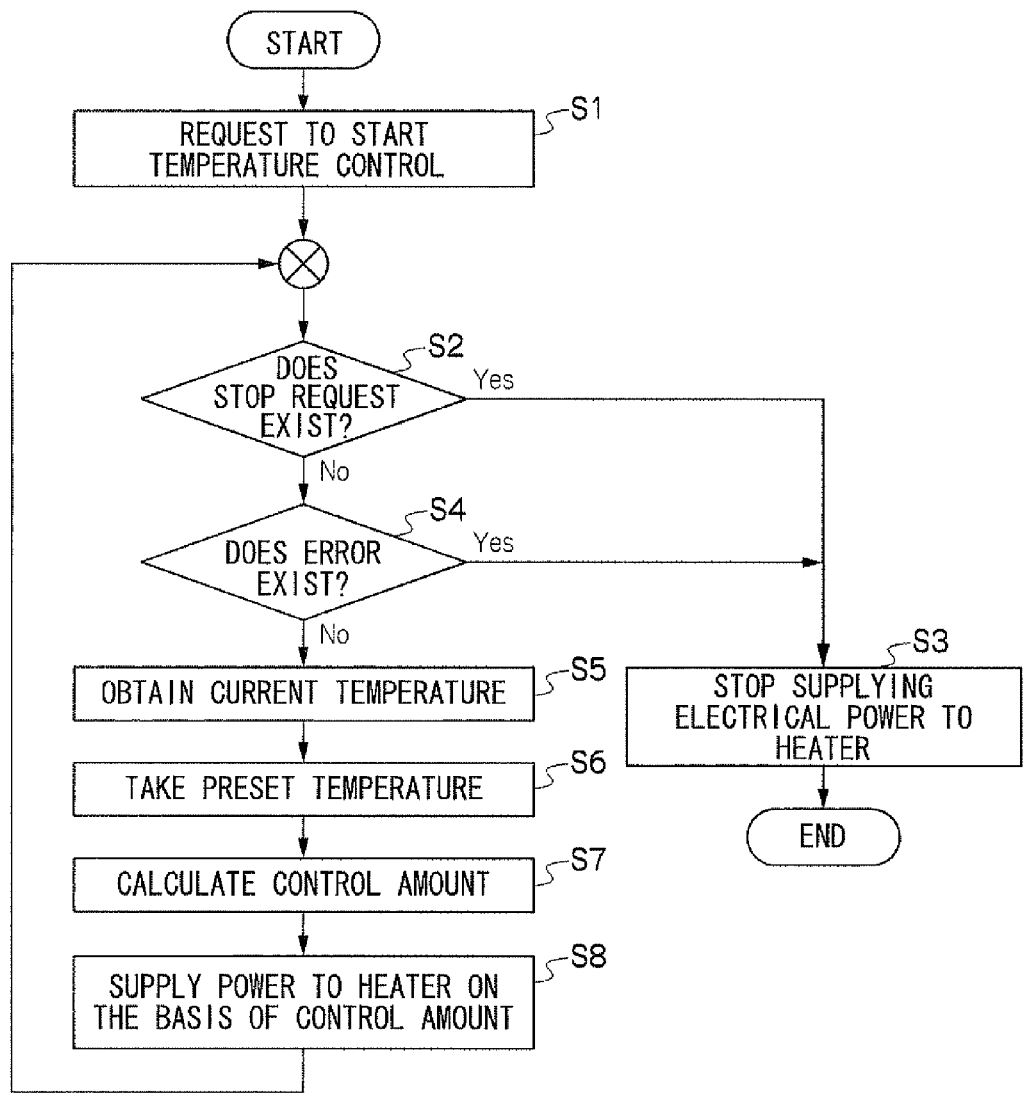
FIG. 5 is a flowchart showing control proceeding of the inspection apparatus according to the first embodiment of the present invention.

The inspection apparatus 10 is operated in the following manner. The operation will be described with reference to a flowchart of FIG. 5. FIG. 5 mainly shows control procedures by a header controller.

First, with a start of processing, when a start request of temperature control is made (Step S1), the heater controller 30 determines whether or not a stop request for stopping power to the heater is made (Step S2). When the stop request is made (in case of starting inspection), the heater controller 30 stops supplying power to the heater (Step S3). That is to say, relay contacts of the heater power interrupting relays 133 are opened to cut off the heaters 62 from electric power. This completely suppresses a current flowing through the heaters 62, cables, and the like passing a neighborhood of the contacts 14, thereby suppressing a noise wave generated from the heaters 62 and the like.

When the stop request is not made in Step 2, the heater controller 30 determines whether or not an error exists (Step S4). When an error exists, the heater controller 30 stops supplying power to the heater (Step S3). When no error exists, the heater controller 30 obtains a present temperature from a control sensor 126 (Step S5). Subsequently, the heater controller 30 takes a preset temperature (Step S6). The heater controller 30 calculates a control amount on the basis of difference between the present temperature and the preset temperature (Step S7). Further, the power source 32 supplies power to the heater based on the calculated control amount given from the heater controller 30 (Step S8). Flow proceeds back to Step S2 to repeat the above processes.

Therefore, it is possible to perform an accurate temperature control, and cut a noise wave by interrupting the power supplying to the heater 62 by the heater power interrupting relays 133. As a result, inspection accuracy is improved.

(B) Second Embodiment

Next, a second embodiment of the invention will be described referring to the attached drawings. As the entire structure of the inspection apparatus 10 in the second embodiment is the same as one in the first embodiment, the same reference numerals are given to the same members, and the description will be omitted.

Figure 6:
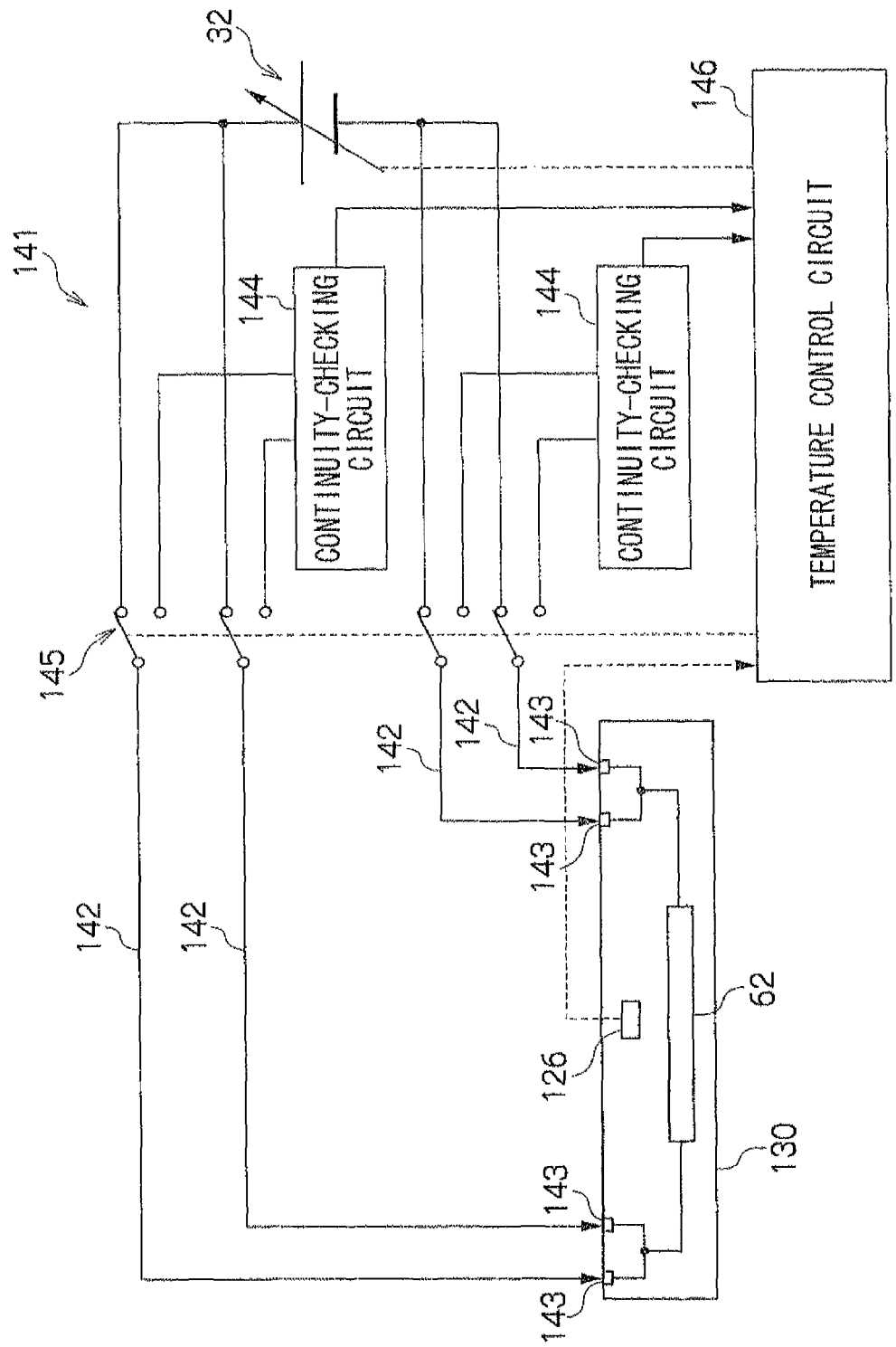
FIG. 6 is a schematic view showing a circuit arrangement of a continuity-checking device of a lighting inspection apparatus according to a second embodiment of the present invention.

As shown in FIG. 6, the inspection apparatus of the second embodiment includes a continuity-checking device 141. The continuity-checking device 141 is possible to connect a connecting point which the electric power supply system detachably contacts. The continuity-checking device 141 includes four checking cables 142, connecting points 143, two continuity-checking circuits 144, directional switches 145, and a temperature control circuit 146. The four checking cables 142 are provided in two pairs in parallel. The connecting points 143 are provided at an end of the checking cables 142 and are contacted the end of the heater 62 at two points. Each of the two continuity-checking circuits 144 is connected to two checking cables 142 through the directional switches 145 for checking continuity between the checking cables 142. First and second directional switches 145 are connected to first and second checking cables 142. The first and second directional switches 145 are switched to the first continuity-checking circuit 144 or a positive side of the power sources 32 of the electric power supply system. Third and fourth directional switches 145 are connected to third and fourth checking cables 142. The third and fourth directional switches 145 are switched to the second continuity-checking circuit 144 or a negative side of the power sources 32 of the electric power supply system. The temperature control circuit 146 includes a continuity confirming circuit and controls all this continuity-checking device 141. The temperature control circuit 146 is connected to the continuity-checking circuits 144, the directional switches 145, the control sensor 126, and the power supply 32. The temperature control circuit 146 is controlled according to a flowchart as shown in FIG. 8.

Figure 7:
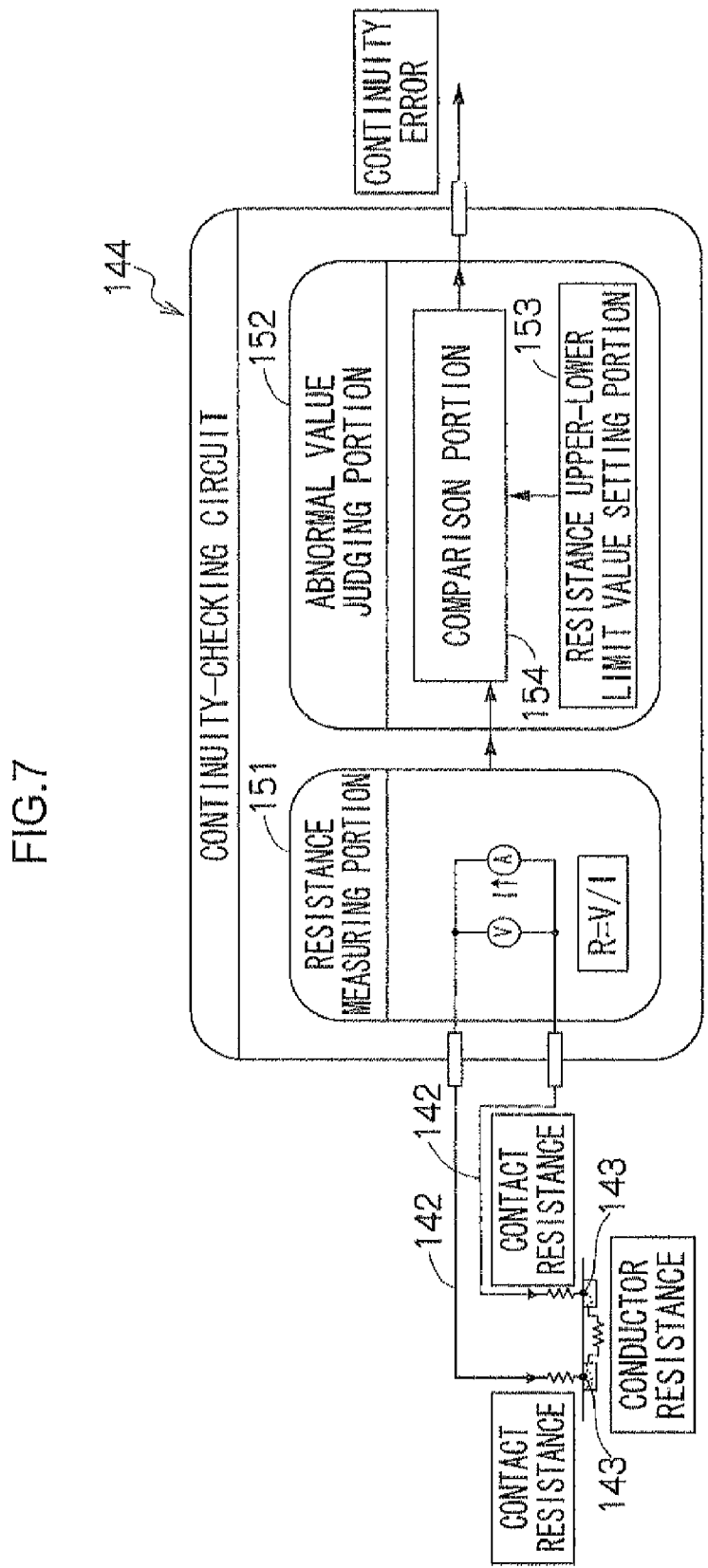
FIG. 7 is a schematic view showing a structure of the continuity-checking device of the inspection apparatus according to the second embodiment of the present invention.

As shown in FIG. 7, each of the continuity-checking circuit 144 includes a resistance measuring portion 151 and an abnormal value judging portion 152. The resistance measuring portion 151 measures a resistance value when two connecting points 143 contact with the object. The abnormal value judging portion 152 judges whether or not a resistance value measured by the resistance measuring portion 151 is an abnormal value. The abnormal value judging portion 152 includes a resistance upper-lower limit value setting portion 153 and a comparison portion 154. The resistance upper-lower limit value setting portion 153 presets an upper limit and a lower limit of a resistance value. The comparison portion 154 takes and compares the resistance value measured by the resistance measuring portion 151 and the upper limit and the lower limit value set by the resistance upper-lower limit value setting portion 153. And the comparison portion 154 judges whether or not the resistance value measured by the resistance measuring portion 151 is within the range from the lower limit value to the upper limit value.

Although FIG. 6 shows as if the continuity-checking device 141 is applied to an electric power supply, the continuity-checking device 141 can be applied to both an electric power supply system and a signal system.

The continuity-checking device 141 is operated in the following manner. The operation of the continuity-checking device 141 will be described with reference to a flowchart as shown in FIG. 8.

A process is started and when a start instruction of temperature control is received from a control circuit such as a tester (Step S11), the temperature control circuit 146 instructs the directional switches 145 to switch from the power source 32 to the continuity-checking circuits 141 (Step S12).

Next, in accordance with the instruction of the temperature control circuit 146, the resistance measuring portion 151 measures a resistance value (Step S13) and the abnormal value judging portion 152 judges whether or not a resistance value is abnormal (Step S14). When the abnormal value judging portion 152 judges that a resistance value is abnormal, a continuity error alarm is transmitted to the control circuit (Step S15). When the abnormal value judging portion 152 judges that the resistance value is not abnormal, the directional switches 145 switch from the continuity-checking circuits 141 to the power source 32 (Step S16).

Next, a normal temperature control process is started (Step S17).

Accordingly, contact failure of the connecting points 143 is detected and solved and measuring accuracy is improved.

(C) Modifications

In the first embodiment, the heater power interrupting relays 133 are used as heater power controlling open/close switches. However, other switching elements such as transistors (FET, bipolar transistor) may be used.

The inspection apparatus of the present invention can be used for any inspection apparatus required to make inspection while heating.

The invention claimed is:
1. An inspection apparatus, comprising:
a probe device having a contact for contacting with an electrode of an inspected object and having a built-in heater for correcting dislocation of the contact to the electrode caused by temperature difference between the probe device and the inspected object;
a tester for testing the probe device and supplying electric power to the heater;
an electric power supply system, provided on the tester, for supplying electric power to the heater;
a temperature control unit for controlling electric power to the heater of the probe device, through the electric power supply system;
at least one open/close switch for switching on and off electric power to the heater; and
a continuity-checking device which checks ability to supply electric power to the heater from the electric power supply system,
wherein the continuity-checking device includes:
two parallel checking cables;
connecting points provided at an end of the checking cables and detachably contacted at two points connected to the same end of the heater;
a continuity-checking circuit, which is connected to two checking cables, for checking continuity between the checking cables contacted at the connecting points; and directional switches for switching and connecting the two checking cables to the continuity-checking circuit or the electric power supply system.

2. The inspection apparatus according to claim 1, further comprising:
a connector between the tester and the probe device, and wherein the open/close switch is provided in the tester adjacent the connector.

3. The inspection apparatus according to claim 1, wherein the connector includes:
a male connector provided on one end of a wiring of the electric power supply system and a wiring of the probe device; and
a female connector provided on the other end,
the male connector includes:
a bar-shaped conductive portion connected to the wiring of the electric power supply system;
a supporting portion made of an electrical insulating material for surrounding and supporting the conductive portion; and
a protective cylinder made of an electrical insulating material for internally holding the supporting portion,
the female connector includes:
an electric insulator having a recess opened to the male connector for detachably holding the male connector; and
a connection bar portion, slidably supported in the electric insulator, for protruding to the recess.

4. The inspection apparatus according to claim 1, wherein the open/close switch is a relay or transistor.

5. An inspection apparatus, comprising:
a probe device having a contact for contacting with an electrode of an inspected object and having a built-in heater for correcting dislocation of the contact to the electrode caused by temperature difference;
a tester for testing probe device and supplying electric power to the heater;
an electric power supply system, provided on the tester, for supplying electric power to the heater;
a temperature control unit for controlling electric power to the heater of the probe device through the electric power supply system; and
a continuity-checking device which checks to be able to supply electric power to the heater from the electric power supply system;
wherein the continuity-checking device includes:
two parallel checking cables;
connecting points provided at an end of the checking cables and detachably contacted at points connected to the same end of the heater;
a continuity-checking circuit, which is connected to two checking cables, for checking continuity between the checking cables contacted at the connecting points; and
directional switches for switching and connecting the two checking cables to the continuity-checking circuit or the electric power supply system.

6. The inspection apparatus according to claim 5, wherein
a connection portion between the electric power supply system and the probe device includes a connector,
the connector includes:
a male connector provided on one end of a wiring of the electric power supply system and a wiring of the probe device; and
a female connector provided on the other end,
the male connector includes:
a bar-shaped conductive portion connected to the wiring of the electric power supply system;
a supporting portion made of an electrical insulating material for surrounding and supporting the conductive portion; and
a protective cylinder made of an electrical insulating material for internally holding the supporting portion,
the female connector includes:
an electric insulator having a recess opened to the male connector for detachably holding the male connector; and
a connection bar portion, slidably supported in the electric insulator, for protruding to the recess.

* * * * *